United States Patent
Lee et al.

(10) Patent No.: US 9,640,298 B2
(45) Date of Patent: May 2, 2017

(54) SILVER PASTE COMPOSITION FOR FORMING AN ELECTRODE, AND SILICON SOLAR CELL USING SAME

(75) Inventors: Su-Hee Lee, Daejeon (KR); Soo-Yeon Heo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 518 days.

(21) Appl. No.: 13/885,988

(22) PCT Filed: Nov. 18, 2011

(86) PCT No.: PCT/KR2011/008843
§ 371 (c)(1),
(2), (4) Date: Aug. 5, 2013

(87) PCT Pub. No.: WO2012/067463
PCT Pub. Date: May 24, 2012

(65) Prior Publication Data
US 2013/0306144 A1    Nov. 21, 2013

(30) Foreign Application Priority Data

Nov. 18, 2010    (KR) .................. 10-2010-0114973

(51) Int. Cl.
*H01L 31/00* (2006.01)
*H01B 1/24* (2006.01)
*H01B 1/22* (2006.01)
*H01L 31/0224* (2006.01)

(52) U.S. Cl.
CPC .............. *H01B 1/24* (2013.01); *H01B 1/22* (2013.01); *H01L 31/022425* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 2009/0266409 A1* | 10/2009 | Wang | ........... | H01B 1/16 136/252 |
| 2010/0059106 A1* | 3/2010 | Akimoto | ........... | H01B 1/16 136/252 |
| 2012/0000523 A1* | 1/2012 | Park | ........... | H01B 1/16 136/256 |
| 2012/0012153 A1* | 1/2012 | Azechi | ........... | H01B 1/22 136/244 |

FOREIGN PATENT DOCUMENTS

| | | |
|---|---|---|
| CN | 101728438 A | 6/2010 |
| JP | 11-330506 | 11/1999 |
| JP | 2005-317898 | 11/2005 |
| JP | WO 2010103998 A1 * 9/2010 ............ H01B 1/22 |

(Continued)

*Primary Examiner* — Eli Mekhlin
(74) *Attorney, Agent, or Firm* — Dentons US LLP

(57) ABSTRACT

The present invention relates to a silver paste composition for forming an electrode, and a silicon solar cell using the same. More particularly, the present invention relates to a silver paste composition for forming an electrode, which includes carbon black having specific parameter characteristics to improve rheological properties of the paste and printability, thereby achieving a high aspect ratio and improving electrical characteristics, and a silicon solar cell using the same.

10 Claims, 4 Drawing Sheets

(56) References Cited

FOREIGN PATENT DOCUMENTS

| KR | 10-2009-0126427 | 12/2009 | |
|---|---|---|---|
| KR | WO 2009148259 A2 * | 12/2009 | ............... H01B 1/16 |
| KR | 10-2010-0042766 | 4/2010 | |
| KR | 1020100110891 A | 10/2010 | |
| TW | 200703700 | 1/2007 | |
| WO | 2009148259 A2 | 12/2009 | |
| WO | 2010103998 A1 | 9/2010 | |

* cited by examiner

A conventional silicon solar cell

SILVER PASTE COMPOSITION FOR FORMING AN ELECTRODE, AND SILICON SOLAR CELL USING SAME

This application is a National Stage Entry of International Application No. PCT/KR2011/008843, filed Nov. 18, 2011, and claims the benefit of Korean Application No. 10-2010-0114973 filed on Nov. 18, 2010, all of which are hereby incorporated by reference in their entirety for all purposes as if fully set forth herein.

TECHNICAL FIELD

The present invention relates to a silver paste composition for forming an electrode, and a silicon solar cell using the same. More particularly, the present invention relates to a silver paste composition for forming an electrode, which forms a stable contact between a front electrode and an emitter of a solar cell and achieves a high aspect ratio, thereby capable of improving electrical characteristics of the solar cell, and a silicon solar cell using the same.

BACKGROUND ART

With recent development of electronic industry, there is a demand for miniaturization and high reliability of electronic products and devices. To meet the demand, various attempts have been made to form circuit patterns or electrodes of electronic products requiring high integration. Under such circumstances, use of a conductive metal paste is the center of interest because it hardly generates by-products or contaminants during a process.

A typical metal paste includes a conductive metal, a glass frit and an organic binder. The conductive metal includes silver, aluminum or the like. Of them, silver is generally used. The conductive metal paste is mainly used to mount a hybrid IC or a semiconductor IC, or to form various condensers or electrodes, and recently has the expanded application range to high-tech electronic products such as PCBs, ELs, touch panels, RFIDs, LCDs, PDPs or solar cells. With expansion and development of the related industry, a demand for the conductive metal paste is increasing.

In particular, as it is expected that conventional energy sources such as oil or charcoal will be exhausted, interests in alternative energy are increasing. Among them, a solar cell has abundant energy sources and does not cause an environmental pollution, and thus it becomes an object of attention.

The solar cell is classified into a solar heat cell that produces vapor required to run a turbine using a solar heat, and a solar light cell that converts photons into an electrical energy using properties of a semiconductor. Generally, the solar light cell (hereinafter, referred to as a solar cell) is represented as a solar cell.

The solar cell largely includes a silicon solar cell, a compound semiconductor solar cell and a tandem solar cell according to the raw material. Among these three solar cells, the silicon solar cell leads the solar cell market.

FIG. 1 is a cross-sectional view illustrating a basic structure of a silicon solar cell. Referring to this figure, the silicon solar cell includes a substrate 101 of a p-type silicon semiconductor, and an emitter layer 102 of an n-type silicon semiconductor. A p-n junction is formed at an interface between the substrate 101 and the emitter layer 102 in the similar way to a diode. In addition, FIG. 2 is a schematic view of the constitution of a front electrode in the solar cell structure. As shown in FIG. 2, the front electrode of the solar cell includes Ag formed on a front side and conductive aluminum and silver formed on a back side of the substrate. In this regard, the front electrode is, not shown in the figure, connected to the emitter layer by penetrating through an anti-reflection film during formation of the silicon solar cell.

When light falls on the solar cell having the above-mentioned structure, electrons and electron holes are created in a silicon semiconductor doped with impurities by the photovoltaic effect. For reference, electrons are created in the emitter layer 102 of an n-type silicon semiconductor as a plurality of carriers, and electron holes are created in the substrate 101 of a p-type silicon semiconductor as a plurality of carriers. The electrons and electron holes created by the photovoltaic effect are drawn toward the n-type silicon semiconductor and the p-type silicon semiconductor, and move to the front electrode 103 on the emitter layer 102 and a back electrode 104 below the substrate 101, respectively. Then, these electrodes 103, 104 are connected by a wire, so that the current flows.

The conductive metal paste is used to form the front or back electrode in the solar cell, in addition to various electrodes of other electronic products as mentioned above.

The front electrode (Ag electrode) of a commercial crystalline silicon solar cell is formed by a screen printing process. The front electrode formed on the front side of the silicon substrate needs to have a smaller line width and a larger line height to improve electrical conversion efficiency.

However, it is difficult to achieve a small line width during sintering, after screen-printing of the conventional silver paste on the substrate. It is also difficult to form a stable contact between the front electrode and the emitter of the solar cell during the sintering process of the substrate, after the screen-printing process of the paste. Thus, a broad range of thermal treatments is not available.

DISCLOSURE

Technical Problem

An object of the present invention is to provide a silver paste composition for forming an electrode, which forms a stable contact between a front electrode and an emitter of a solar cell during thermal treatment and improves printability to achieve a small line width and a high aspect ratio of the electrode, thereby improving electrical conversion efficiency and electrical characteristics of the solar cell, and a silicon solar cell using the same.

Technical Solution

The present invention provides a silver paste composition for forming an electrode including silver powder, glass frit powder, an organic binder and carbon black, and having a viscosity of approximately 90,000 to 500,000 cP (Brookfield viscometer, spindle 14, test temperature 25° C.), in which the carbon black has an average particle size of approximately 0.1 μm to 0.5 μm and a specific surface area of approximately 100 to 200 $m^2/g$, and is included in an amount of approximately 1 to 10% by weight, based on the total weight of the silver paste composition.

In the present invention, the silver powder preferably include spherical silver powder having an average particle size of approximately 1 μm to 3 μm and flake type silver powder having an average particle size of approximately 1 μm to 3 μm.

The content of the spherical silver powder having an average particle size of approximately 1 μm to 3 μm may be approximately 70 to 85% by weight, based on the total weight of the silver paste composition. In addition, the content of the flake type silver powder having an average particle size of approximately 1 μm to 3 μm may be approximately 1 to 5% by weight, based on the total weight of the silver paste composition.

Further, the present invention provides a front electrode for a solar cell, which is formed by using the silver paste composition.

A crystalline silicon solar cell composed of the electrode may have a photo-conversion efficiency of approximately 17 to 18%.

Further, the present invention provides a silicon solar cell including a silicon semiconductor substrate;
an emitter layer formed on the top surface of the substrate;
an anti-reflection film formed on the emitter layer;
a front electrode connected to the emitter layer by penetrating through the anti-reflection film; and
a back electrode having an aluminum layer that is connected to the back surface of the substrate and;
in which the front electrode is formed by coating the silver paste composition on the anti-reflection film in a predetermined pattern and sintering the silver paste composition.

Advantageous Effects

By addition of carbon black having specific parameter characteristics to the silver paste composition for forming an electrode of the present invention, a stable fire-through occurs during thermal treatment of a front electrode-printed solar cell, thereby improving the fill factor. Further, the carbon black improves the rheological properties of the paste to achieve a high aspect ratio when patterns are formed by screen-printing, and therefore, electrical characteristics of the solar cell are improved.

DESCRIPTION OF DRAWINGS

The following accompanying drawings illustrate preferred embodiments of the present invention, and are provided for further understanding of the technical idea of the invention which will be described later along with a detailed description of the present invention, so that those listed on the drawings are not to be construed to limit the present invention.

REFERENCE NUMERALS

Figure 1:
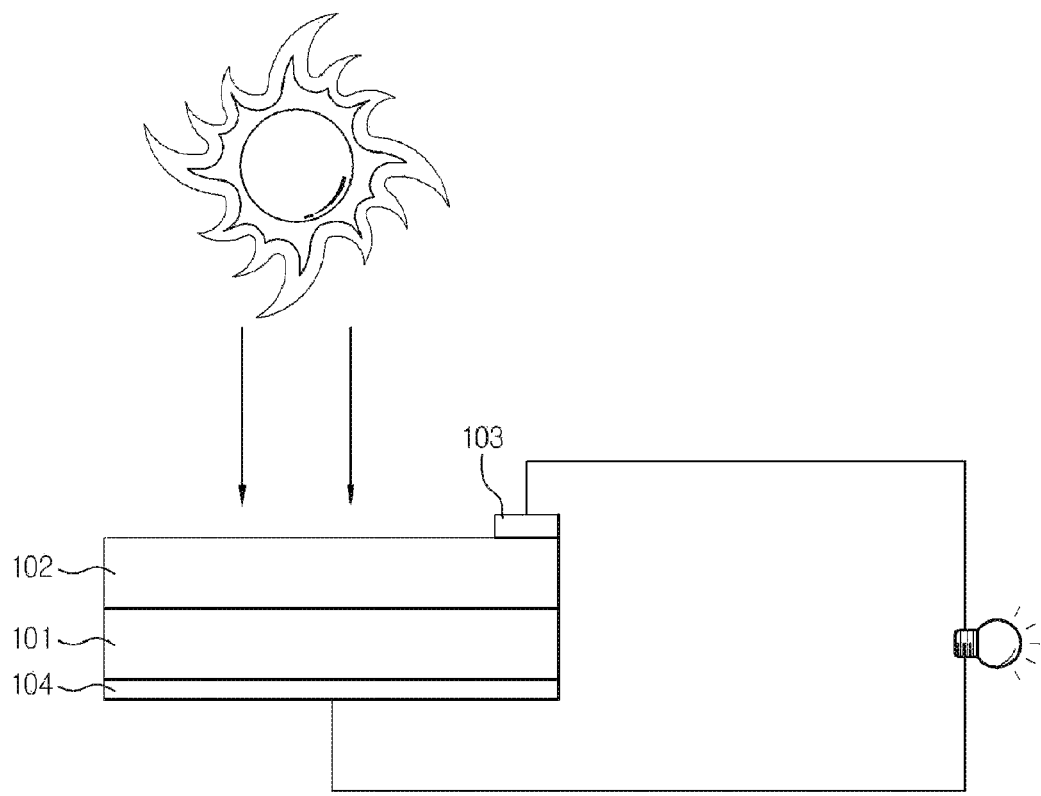
FIG. 1 is a schematic cross-sectional view illustrating a structure of a conventional silicon solar cell.

101: Substrate
102: Emitter layer
103: Front electrode
104: Back electrode
201: Substrate
202: Anti-reflection film
203: Front electrode
204: BSF layer
205: Back electrode
206: Back Ag pattern

BEST MODE

Hereinafter, the present invention will be described in more detail. It should be understood that the terms or words used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

The present invention provides a silver paste composition for forming a front electrode, which includes carbon black having specific parameter characteristics in a specific amount to provide stability during thermal treatment and to improves printability for fine pattern formation, thereby improving a high aspect ratio and electrical characteristics, and a silicon solar cell using the same.

According to one preferred embodiment of the present invention, provided is a silver paste composition for forming an electrode including silver powder, glass frit powder, an organic binder and carbon black and having a viscosity of approximately 90,000 to 500,000 cP (Brookfield viscometer, spindle 14, test temperature 25° C.), in which the carbon black has an average particle size of approximately 0.1 μm to 0.5 μm and a specific surface area of approximately 100 to 200 m$^2$/g, and is included in an amount of approximately 1 to 10% by weight, based on the total weight of the silver paste composition.

That is, the silver paste composition for forming an electrode of the present invention is characterized in that it includes carbon black satisfying all the parameter conditions such as an average particle size in a specific range of approximately 0.1 μm to 0.5 μm and a specific surface area of approximately 100 to 200 m$^2$/g. More preferably, the carbon black may have an average particle size of approximately 0.2 μm to 0.4 μm and a specific surface area of approximately 120 to 150 m$^2$/g.

In this regard, the carbon black may be those obtained by pulverization of particles having a secondary average particle size of 0.5 to 2 μm, which are prepared by aggregation of the particles having a primary average particle size of 10 to 50 nm and a specific surface area of 50 to 400 m$^2$/g, preferably a primary average particle size of 20 to 30 nm and a specific surface area of 100 to 200 m$^2$/g.

Therefore, the final silver paste composition includes carbon black fine particles having the above described size and specific surface area. When it is used to form a pattern by screen-printing, the line height can be increased, thereby improving photo-conversion efficiency. In particular, the present invention improves rheological properties related to viscosity and adhesion of a paste. Thus, a stable fire-through occurs during thermal treatment of the front electrode manufactured by using the silver paste composition of the present invention, thereby improving the fill factor. In addition, when the pattern is formed by the screen printing process generally used for manufacturing the electrode, it is easy to control the pattern, thereby achieving a small line width and a high aspect ratio.

In this regard, if the average particle size of the carbon black is less than 0.1 μm, there is a problem in increasing viscosity of the paste, and if the size is more than 0.5 μm, its dispersion with other solid components of the paste is reduced to deteriorate electrical performance. In addition, if the specific surface area of the carbon black is less than approximately 100 m$^2$/g, it is not sufficiently mixed with organic vehicles during a dispersion process, and if the specific surface area is more than approximately 200 m$^2$/g, the viscosity of the paste is problematically increased. Therefore, to obtain a paste having a desired viscosity, the carbon black included in the silver paste composition should have the average particle size and the specific surface area satisfying the above described range. Finally, a fine pattern having a large line height can be obtained. In other words, even though the carbon black in the final silver paste composition has the average particle size satisfying the range of the present invention, thixotropic properties can be deteriorated when its specific surface area is not within the range of the present invention. In addition, even though the carbon black in the final silver paste composition has the specific surface area satisfying the range of the present invention, uniform dispersion of the paste composition can be deteriorated when its average particle size is not within the range of the present invention.

Further, the carbon black of the present invention may be included in an amount of approximately 1 to 10% by weight, more preferably approximately 3 to 7% by weight, and most preferably approximately 3 to 4% by weight, based on the total weight of the silver paste composition. If the content of the carbon black is less than approximately 1% by weight, thixotropic index (T. I) of the paste is reduced and if the content is more than approximately 10% by weight, clogging of a mask occurs during screen-printing.

In the silver paste composition of the present invention, a mixture of the silver powders having the particle size and shape controlled within the specific range is preferably used for stable fire-through and uniform final sintering during thermal treatment. Therefore, the silver powder used in the present invention may be a mixture of spherical silver powder having an average particle size of approximately 1 μm to 3 μm and flake type silver powder having an average particle size of approximately 1 μm to 3 μm. The content of the spherical silver powder having an average particle size of approximately 1 μm to 3 μm is preferably approximately 70 to 85% by weight, based on the total weight of the silver paste composition. In addition, the content of the flake type silver powder having an average particle size of approximately 1 μm to 3 μm is preferably approximately 1 to 5% by weight, based on the total weight of the silver paste composition.

With respect to the silver powder, if the average particle size of each silver powder is less than approximately 1 μm, there is a problem of poor fire-though, and if the average particle size of each silver powder is more than approximately 3 μm, the viscosity of the paste is reduced to lower the aspect ratio of the pattern. In addition, if the content of the spherical silver powder having an average particle size of approximately 1 μm to 3 μm is less than approximately 70% by weight, the resistance of the electrode can increase, and if the content is more than approximately 85% by weight, flowability between the powders suitable for printability of the paste becomes poor. If the content of the flake type silver powder having an average particle size of approximately 1 μm to 3 μm is less than approximately 1% by weight, the contact to the emitter layer becomes poor, and if the content is more than approximately 5% by weight, the paste flowability suitable for printing is deteriorated.

Further, the glass frit powder usable in the present invention may include, but is not limited to, any glass frit used conventionally in the art. For example, the glass frit powder may include, but is not limited to, lead-free bismuth-based compounds. Specifically, the glass frit powder may include, but is not limited to, $Bi_2O_3$—$B_2O_3$—$SiO_2$-based or $Bi_2O_3$—$B_2O_3$—ZnO-based powder, and they may be used alone or in combination of two or more thereof.

The organic binder may be used to prepare the silver powder, the glass frit powder and the carbon black in a paste phase. The organic binder used in the present invention may include, but is not limited to, any organic binder that is generally used for preparing a silver paste composition in the art. For example, the organic binder may include, but is not limited to, any one selected from the group consisting of a cellulose resin, an acryl-based resin, butyl carbitol, and terpineol, or mixtures of two or more thereof, and preferably, ethyl cellulose or an acrylate-based polymer resin.

Further, the content ranges of the glass frit and the organic binder are not particularly limited, as long as the content ranges allow easy formation of an electrode and preparation of a paste of viscosity advantageous to screen printing, providing a suitable aspect ratio for preventing the paste from flowing down after screen printing.

For example, the content of the glass frit may be preferably approximately 1 to 5% by weight, and more preferably approximately 2 to 3% by weight, based on the total weight of the silver paste composition.

The content of the organic binder may be preferably approximately 5 to 15% by weight, and more preferably approximately 8 to 12% by weight, based on the total weight of the silver paste composition.

Optionally, the silver paste composition of the present invention may further include an additional agent without departing from the spirit and scope of the invention. For example, the composition may further include conductive metal particles, an anti-foaming agent, a dispersing agent, a plasticizer or the like, if necessity. The silver paste composition of the present invention may further include an organic solvent.

Meanwhile, a preparation method of the silver paste composition of the present invention is not particularly limited, and it is possible to prepare the silver paste composition by the method well known in the art.

For one preferred example, the silver paste composition may be prepared by putting the spherical and flake type silver powders, the glass frit powder, the binder and the carbon black powder in a mixer at the same time, and mixing them. At this time, the carbon black is mixed in advance to have a proper average particle size, and then pulverization of the paste may be carried out.

The resulting silver paste composition of the present invention may have a viscosity of approximately 90,000 to 500,000 cP, and more preferably approximately 100,000 to 500,000 cP. In addition, the viscosity means a value that is measured by using a Brookfield viscometer under the conditions of spindle 14 and temperature of 25° C.

Meanwhile, according to another embodiment of the present invention, the present invention provides a front electrode for a solar cell, which is manufactured by using the silver paste composition including the carbon black having the specific parameters described above.

This front electrode may be manufactured by the method well known in the art, and the method is not particularly limited.

The method for manufacturing a front electrode using the silver paste for forming a front electrode according to the present invention will be described in more detail with reference to one example.

The method for manufacturing the front electrode of the present invention may include the steps of coating the silver paste composition on the substrate in a predetermined pattern and sintering it.

At this time, the substrate may include an anti-reflection film and an emitter layer. In addition, the substrate may be a substrate that is typically used for manufacturing a semiconductor device, and for example, preferably a silicon substrate.

The thickness of the silver paste composition applied to the substrate is not particularly limited, and preferably approximately 20 to 40 μm, considering a stable electrical conductivity.

In addition, when the substrate is sintered, the rheological properties of the silver paste is improved by the carbon black satisfying the specific parameter conditions, which is included in the silver paste composition, and thus, the problem of thermal treatment range limited from 790 to 820° C. can be solved. According to the present invention, therefore, the sintering can be carried out in a wide range of peak temperature from 700 to 900° C., preferably from 750 to 850° C. for 30 seconds to 1 minute. At this time, the carbon black is burned-out through sintering of the substrate, but is effectively used for improving rheological properties of the silver paste, thereby improving electrical characteristics of the solar cell.

Meanwhile, the present invention provides a solar cell including the front electrode that is manufactured by using the silver paste composition. The solar cell may be a silicon solar cell.

According to the preferred embodiment, the present invention provides a silicon solar cell including a silicon semiconductor substrate; an emitter layer formed on the top surface of the substrate; an anti-reflection film formed on the emitter layer; a front electrode connected to the emitter layer by penetrating through the anti-reflection film; and a back electrode connected to the back surface of the substrate, in which the front electrode is formed by coating the silver paste composition on the anti-reflection film in a predetermined pattern and sintering the silver paste composition.

Hereinafter, a silicon solar cell using the silver paste composition of the present invention will be described with reference to FIG. 2 as one example. However, embodiments described in the specification and the constitutions illustrated in the drawings herein are just one preferred example for the purpose of illustrations only, not intended to represent all the technical aspects of the invention, so it should be understood that various equivalents and modifications thereof could be made at the time of filing.

Figure 2:
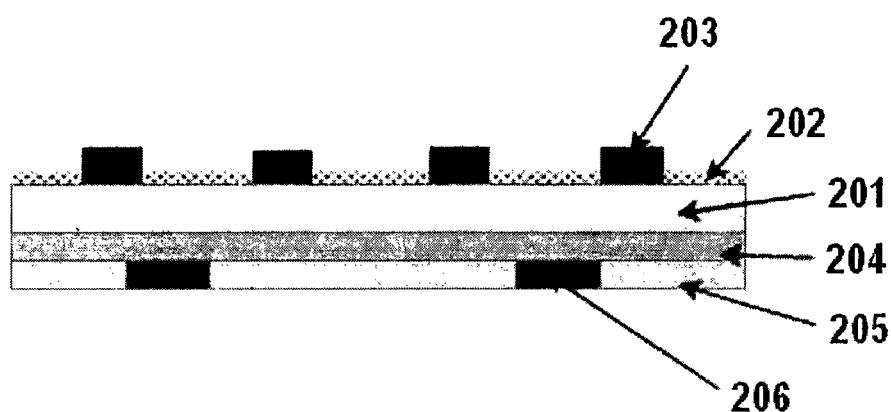
FIG. 2 is a schematic view illustrating a solar cell that is manufactured by using the silver paste composition for forming a front electrode of the present invention.

FIG. 2 is a schematic view illustrating a silicon solar cell that is manufactured using the silver paste composition for forming a front electrode of the present invention.

Referring to FIG. 2, the silicon solar cell according to the present invention includes a silicon semiconductor substrate 201, an emitter layer (not shown) formed on the top surface of the substrate 201, an anti-reflection film 202 formed on the emitter layer, a front electrode 203 connected to the top surface of the emitter layer through the anti-reflection film 202, and a back electrode 205 connected to the back surface of the substrate 201. In addition, a p+ back surface field (BSF) layer 204 may be formed between the back electrode and the substrate, and the back electrode includes a predetermined Ag pattern 206.

The substrate 201 may be doped with p-type impurities of group 3 elements, such as B, Ga, In or the like, and the emitter layer may be doped with n-type impurities of group 5 elements, such as P, As, Sb or the like. When the substrate 201 and the emitter layer are doped with impurities of opposite conductivity type, a p-n junction may be formed at an interface between the substrate 201 and the emitter layer. Meanwhile, the p-n junction may be formed between the substrate 201 doped with n-type impurities and the emitter layer doped with p-type impurities.

The anti-reflection film 202 may passivate a defect (for example, a dangling bond) existing on the surface of or in the bulk of the emitter layer, and may reduce reflectivity of solar rays incident on the front surface of the substrate 201. When the defect existing on/in the emitter layer is passivated, a site where minority carriers are recombinated may be removed, thereby increasing the open-circuit voltage of the solar cell. Also, a reduction in reflectivity of solar rays may increase an amount of light reaching the p-n junction, thereby increasing the short circuit current of the solar cell. Accordingly, the increase in open-circuit voltage and short circuit current of the solar cell by the anti-reflection film 202 may contribute to improvement in conversion efficiency of the solar cell.

For example, the anti-reflection film 202 may have a single film structure of any one selected from the group consisting of a silicon nitride film, a silicon nitride film containing hydrogen (SiNx), a silicon oxide film, a silicon oxynitride film, $MgF_2$, ZnS, $MgF_2$, $TiO_2$ and $CeO_2$, or a multiple film structure of two or more of the material films, but the present invention is not limited thereto. Also, the anti-reflection film 202 may be formed by vacuum deposition, chemical vapor deposition, spin coating, screen printing, or spray coating. However, a method for forming the anti-reflection film 202 according to the present invention is not limited thereto.

The front electrode 203 and the back electrode 205 may be electrodes made from silver and aluminum, respectively. The front electrode 203 may be made from the silver paste composition of the present invention, and the back electrode 205 may be made from the typical aluminum paste composition. The silver electrode may have good electrical conductivity, and the aluminum electrode may have good electrical conductivity and high affinity for the silicon semiconductor substrate 201 to enable good connection therebetween.

The front electrode 203 and the back electrode 205 may be formed by various well-known techniques, and preferably by the screen printing method. That is, the front electrode 203 is formed by screen-printing the silver paste composition of the present invention at a location where the front electrode is formed, followed by thermal treatment. During the thermal treatment, the front electrode may penetrate the anti-reflection film 202 due to a punch-through phenomenon, and may be connected to the emitter layer 202.

Similarly, the back electrode 205 is formed by printing an aluminum paste composition for forming a back electrode, containing aluminum, quartz silica, a binder or the like, on the back surface of the substrate 201, followed by thermal treatment. During the thermal treatment of the back electrode, aluminum, that is, one of the components in the electrode composition may diffuse through the back surface of the substrate 201, so that a back surface field layer 204 may be formed at an interface between the back electrode 205 and the substrate 201. The back surface field layer may prevent carriers from moving to the back surface of the substrate 201 and recombinating. Prevention of carrier recombination may result in an increased open-circuit voltage and an increased fill factor, thereby improving conversion efficiency of the solar cell. In addition, when the aluminium electrode is formed using the aluminium paste, a back Ag pad as the back Ag pattern 206 may be formed in a predetermined pattern by the typical deposition or screen printing method.

In this regard, the front electrode and the back electrode of the present invention may be formed by the typical method such as doctor blade, inkjet printing, and gravure printing, in addition to the screen printing method described above.

Mode for Invention

Hereinafter, the actions and the effects of the present invention will be explained in more detail via specific examples of the invention. However, these examples are merely illustrative of the present invention and the scope of the invention should not be construed to be defined thereby.

Examples 1 to 4

A silver paste composition was prepared by mixing the components according to the composition and content of the following Table 1, and then pulverizing the mixture (unit: % by weight).

In detail, a silver paste including carbon black aggregates prepared by mixing carbon black with a silver powder, a glass frit powder and an organic binder was prepared in each Example. At this time, each of the prepared silver pastes of Examples 1 to 4 had a viscosity of 250,000 cP, 80,000 cP, 40,000 cP and 150,000 cP.

Thereafter, each of the silver pastes was pulverized using a 3-roll mill for uniform dispersion of the particles in the silver paste. Through this method, the silver pastes including carbon black having an average particle size of 0.1 μm were prepared. Each of the final silver pastes obtained in Examples 1 to 4 had a viscosity of 300,000 cP, 90,000 cP, 500,000 cP, and 200,000 cP.

In each Example, the silver powder was a mixture of 80% by weight of spherical silver powder having an average particle size of 1 μm to 3 μm and 2% by weight of flake type silver powder having an average particle size of 2 μm, and the glass frit was $Bi_2O_3$—$B_2O_3$—$SiO_2$ including bismuth oxide and having an average particle size of 10 μm, and the organic binder was ethyl cellulose. In each Example, the carbon black was carbon black particles having a specific surface area of 100 $m^2/g$.

The silver powder used in Example 4 was a mixture of 78% by weight of spherical silver powder having an average particle size of 1 μm to 3 μm and 5% by weight of flake type silver powder having an average particle size of 2 μm.

Comparative Examples 1 to 5

A silver paste composition was prepared by simply mixing the components according to the composition and content of the following Table 1 (unit: % by weight). In Comparative Example 1, no carbon black was used. In Comparative Examples 2 and 3, carbon black was used in an amount of 12% by weight and 0.5% by weight, respectively. In Comparative Example 4, carbon black having an average particle size of 20 nm and a specific surface area of 70 $m^2/g$ was used. In Comparative Example 5, carbon black having an average particle size of 30 nm and a specific surface area of 200 $m^2/g$ was used. In Comparative Example 6, graphite having an average particle size of 3 μm and a specific surface area of 20 $m^2/g$ was used instead of carbon black. In Comparative Example 7, carbon black having an average particle size of 0.3 μm and a specific surface area of 220 $m^2/g$ was used. In Comparative Example 8, carbon black having an average particle size of 1 μm and a specific surface area of 200 $m^2/g$ was used.

Each of the silver paste compositions of Comparative Examples 1 to 5 had a viscosity of 270,000 cP, 600,000 cP, 100,000 cP, 200,000 cP, and 350,000 cP.

TABLE 1

| | Silver powder | Glass frit | Organic binder | Additive Ingredient | Content |
|---|---|---|---|---|---|
| Example 1 | 80 | 2 | 14.5 | Carbon black | 3.5 |
| Example 2 | 80 | 2 | 17 | Carbon black | 1 |
| Example 3 | 80 | 2 | 13 | Carbon black | 5 |
| Example 4 | 83 | 3 | 11.5 | Carbon black | 2.5 |
| Comparative Example 1 | 83 | 3 | 14 | — | — |
| Comparative Example 2 | 73 | 2 | 10 | Carbon black | 12 |
| Comparative Example 3 | 80 | 2 | 17.5 | Carbon black | 0.5 |
| Comparative Example 4 | 80 | 2 | 14.5 | Carbon black[1] | 3.5 |
| Comparative Example 5 | 80 | 2 | 14.5 | Carbon black[2] | 3.5 |
| Comparative Example 6 | 80 | 2 | 14.5 | Graphite | 3.5 |
| Comparative Example 7 | 80 | 2 | 14.5 | Carbon black[3] | 3.5 |
| Comparative Example 8 | 80 | 2 | 14.5 | Carbon black[4] | 3.5 |

Note)
[1] carbon black: average particle size of 20 nm, and specific surface area of 70 $m^2/g$
[2] carbon black: average particle size of 30 nm, and specific surface area of 200 $m^2/g$
[3] carbon black: average particle size of 0.3 μm and specific surface area of 220 $m^2/g$
[4] carbon black: average particle size of 1 μm and specific surface area of 200 $m^2/g$ Experimental Example 1

A silicon solar cell having a structure including a silicon semiconductor substrate 201, an emitter layer formed on the top surface of the substrate 201, an anti-reflection film 202 formed on the emitter layer, a front electrode 203 connected to the top surface of the emitter layer by penetrating through the anti-reflection film 202, and a back electrode 205 connected to the back surface of the substrate 201, as illustrated in FIG. 2, was manufactured by a typical method. At this time, the front electrodes were formed by coating the pastes of Examples 1 to 4 and Comparative Examples 1 to 5 to the substrates by a screen printing method and sintering them. The sintering was carried out at a temperature of 600 to 800° C. for 30 seconds.

Subsequently, physical properties (Jsc, Voc, fill factor (FF), efficiency) of the silicon solar cells that were manufactured by using the pastes of Examples 1 to 4 and Comparative Examples 1 to 5 were measured by a typical method, and then the results are shown in Table 2.

TABLE 2

| | Jsc (mA/cm$^2$) | Voc (mV) | FF | Efficiency (%) |
|---|---|---|---|---|
| Example 1 | 34.9 | 629 | 77.8 | 17.08 |
| Example 2 | 35.1 | 630 | 78.0 | 17.25 |
| Example 3 | 35.0 | 631 | 78.5 | 17.34 |
| Example 4 | 35.4 | 632 | 78.2 | 17.50 |
| Comparative Example 1 | 34.7 | 628 | 76.2 | 16.59 |
| Comparative Example 2 | 34.9 | 629 | 76.1 | 16.71 |
| Comparative Example 3 | 34.4 | 631 | 77.2 | 16.76 |
| Comparative Example 4 | 35.0 | 629 | 76.1 | 16.75 |
| Comparative Example 5 | 34.5 | 626 | 77.7 | 16.78 |
| Comparative Example 6 | 34.1 | 629 | 77.2 | 16.56 |
| Comparative Example 7 | 34.8 | 630 | 77.3 | 16.94 |
| Comparative Example 8 | 35.0 | 629 | 77.5 | 17.06 |

As shown in Table 2, when patterns were formed by screen printing using the silver paste including carbon black fine particles in Examples 1 to 4 of the present invention, high aspect ratio could be achieved. Overall, Examples 1 to 4 showed excellent cell characteristics, in particular, excellent photo-conversion efficiency, compared to Comparative Examples 1 to 8.

In contrast, when the carbon black of the present invention was not used or graphite was used as in Comparative Examples 1 and 6, cell efficiency was decreased, and fill factor was also decreased. Although the carbon black of the present invention was used in an excessively large or small amount as in Comparative Example 2 or Comparative Example 3, fill factor was slightly higher than that of Comparative Example 1, but photo-conversion efficiency was lower than that of Examples 1 to 4. Moreover, when the average particle size and the specific surface area were not within the range of the present invention as in Comparative Example 4, Jsc value was equivalent to that of the present invention, but fill factor and efficiency were decreased to those of Comparative Example 1. Even though the carbon black included in the silver paste composition had the specific surface area similar to that of the present invention as in Comparative Examples 5 and 8, the effects were reduced compared to Examples 1 to 4, because the average particle size was not within the range of the present invention. In this regard, the result of Comparative Example 8 was similar to those of Examples, but viscosity of the paste composition rapidly increased with time, which made it difficult to print. In addition, even though the average particle size of the carbon black used in Comparative Example 7 was similar to that of the present invention, it showed inferior photo-conversion efficiency to that of the present invention, because the specific surface area of the carbon black was not within the range of 100-200 m$^2$/g.

Experimental Example 2

Figure 3:
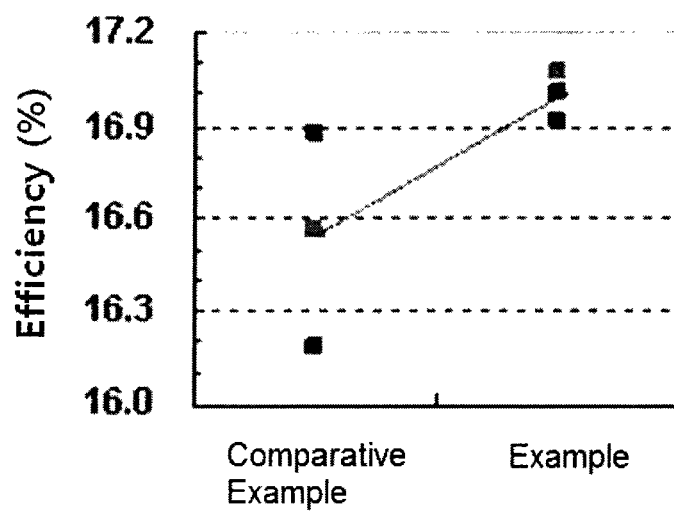
FIG. 3 is a graph showing a comparison of photo-conversion efficiency between the solar cells of Example 1 and Comparative Example 1 according to the present invention.

FIG. 3 is a graph showing a comparison of photo-conversion efficiency between the solar cells of Example 1 and Comparative Example 1 according to the present invention. As shown in FIG. 3, the solar cell of Example 1 of the present invention showed a small line width and improved FF values due to excellent ohmic contact, and thus showed superior energy conversion efficiency to that of Comparative Example 1.

Figure 4:
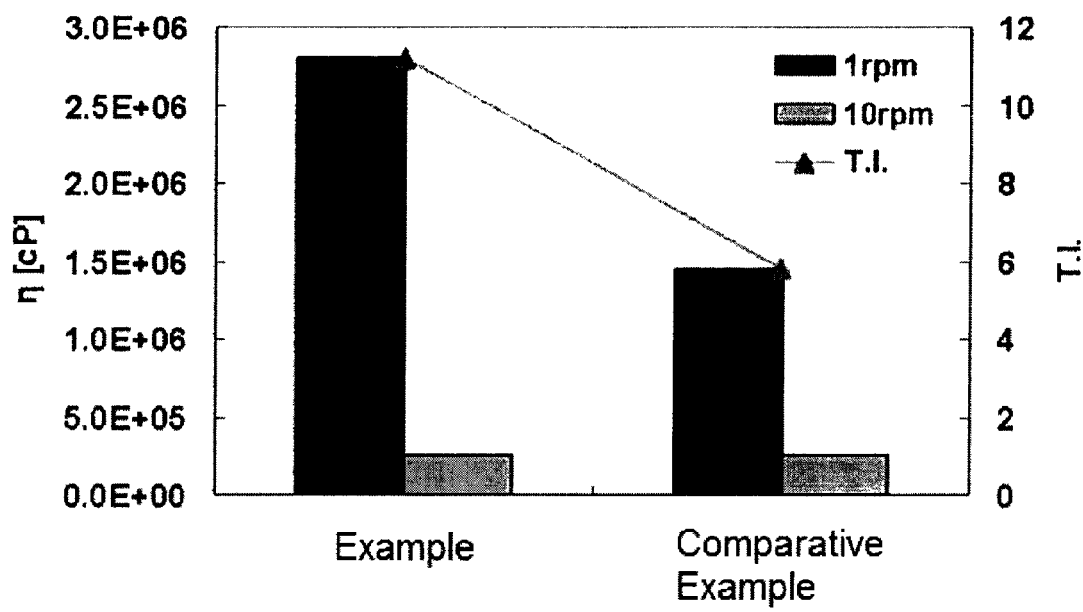
FIG. 4 is a graph showing thixotropic index (T.I) of the pastes of Example 1 and Comparative Example 1 according to the present invention, obtained after measuring their viscosity at 1 rpm and 10 rpm.

With respect to the pastes of Example 1 and Comparative Example 1, thixotropic index (T.I.) was measured by analyzing their viscosity at 1 rpm and 10 rpm using a viscometer, and the results are shown in FIG. 4.

The result of FIG. 4 showed that Example 1 had the rheological properties of high aspect ratio patterns without line spreading in screen printing, compared to Comparative Example 1.

Figure 5:
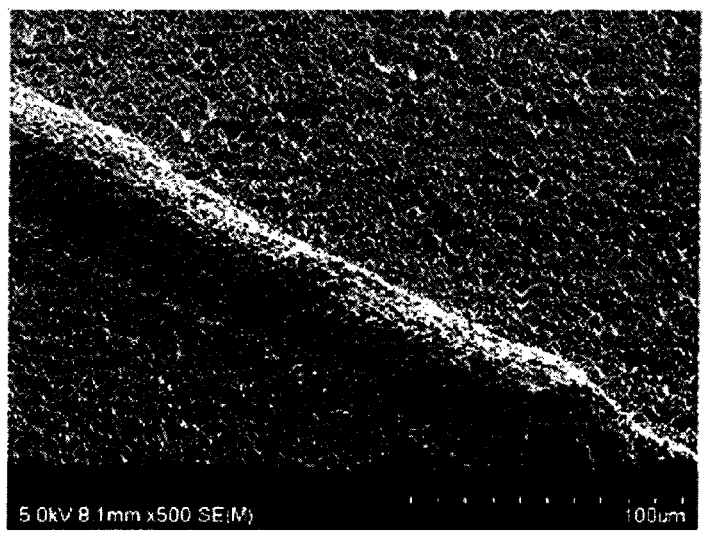
FIG. 5 is an electron microscopic image showing that the electrode of the solar cell of Example 1 has a small line width and a large line height.

FIG. 5 is an electron microscopic image showing that the electrode of the solar cell of Example 1 has a small line width and a large line height. The result of FIG. 5 showed that the electrode according to the present invention had a small line width and a high aspect ratio.

Figure 6:
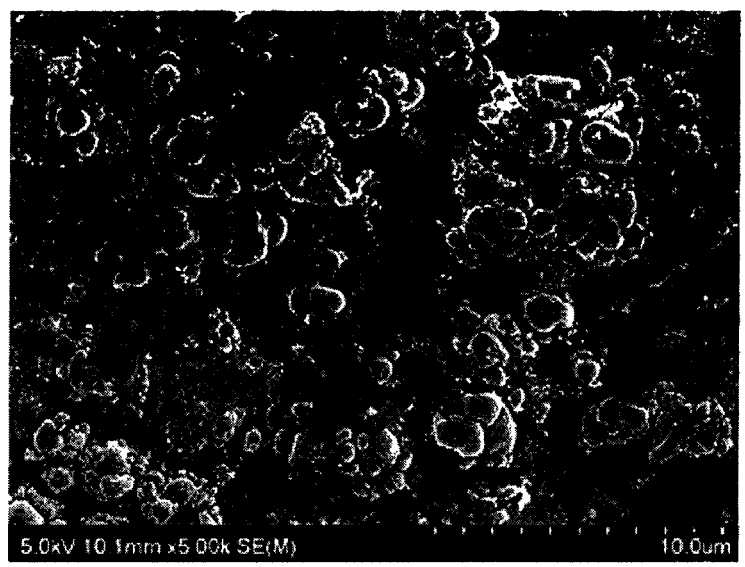
FIG. 6 is an electron microscopic image showing a magnification of the interface between the electrode and silicon after removing the electrode of the silicon solar cell of Example 1 by etching.

FIG. 6 is an electron microscopic image showing a magnification of the interface between the electrode and silicon substrate after etching the electrode of the silicon solar cell of Example 1. FIG. 6 showed that the electrode of Example 1 had a good ohmic-contact with the emitting layer of the substrate, indicating stable Ag recrystallization. That is, FIG. 6 is an electron microscopic image showing that Ag was sufficiently formed in the emitter layer to form a stable ohmic-contact in the electrode of the solar cell of Example 1.

The invention claimed is:

1. A silver paste composition, comprising silver powder, glass frit powder, an organic binder and carbon black, having a viscosity of 90,000 to 500,000 cP measured by Brookfield viscometer at the conditions of spindle 14 and test temperature 25° C.,
   wherein the carbon black has an average particle size of 0.2 μm to 0.4 μm and a specific surface area of 120 to 150 m$^2$/g, and is included in an amount of 3 to 4% by weight, based on the total weight of the silver paste composition, and is a pulverization material of particles having a secondary average particle size of 0.5 to 2 μm, wherein the particles are aggregation materials of the particles having a primary average particle size of 10 to 50 nm and a specific surface area of 50 to 400 m$^2$/g,
   wherein the silver powder includes spherical silver powder having an average particle size of 1 μm to 3 μm and flake type silver powder having an average particle size of 2 μm,
   wherein, as an electrode of a silicon solar cell, the silver paste composition provides a stable ohmic-contact with an emitter and a photo-conversion efficiency of 17.08 to 17.50% of the silicon solar cell.

2. The silver paste composition according to claim 1, wherein the content of the spherical silver powder having an average particle size of 1 μm to 3 μm is 70 to 85% by weight, based on the total weight of the silver paste composition.

3. An electrode for a solar cell that is formed by applying the silver paste composition according to claim 2 to a substrate.

4. The silver paste composition according to claim 1, wherein the content of the flake type silver powder having an average particle size of 2 μm is 1 to 5% by weight, based on the total weight of the silver paste composition.

5. An electrode for a solar cell that is formed by applying the silver paste composition according to claim 4 to a substrate.

6. The silver paste composition according to claim 1, wherein the glass fit powder includes bismuth-based compounds.

7. An electrode for a solar cell that is formed by applying the silver paste composition according to claim 6 to a substrate.

8. The silver paste composition according to claim 1, wherein the organic binder is any one selected from the group consisting of a cellulose resin, an acryl-based resin, butyl carbitol, and terpineol, or mixtures of two or more thereof.

9. An electrode for a solar cell that is formed by applying the silver paste composition according to claim 8 to a substrate.

10. An electrode for a solar cell that is formed by applying the silver paste composition according to claim 1 to a substrate.

* * * * *